(12) United States Patent
Onishi et al.

(10) Patent No.: US 9,390,958 B2
(45) Date of Patent: Jul. 12, 2016

(54) TRANSFER UNIT INCLUDING SUCTION OPENINGS CONFIGURED TO RECEIVE SUCTION PADS OR SEAL MEMBERS THEREIN

(71) Applicant: DISCO CORPORATION, Tokyo (JP)

(72) Inventors: Kenta Onishi, Tokyo (JP); Kimitake Mantoku, Tokyo (JP); Shigefumi Okada, Tokyo (JP); Hiroyuki Urabe, Tokyo (JP); Yuki Watanabe, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 14/823,640

(22) Filed: Aug. 11, 2015

(65) Prior Publication Data

US 2016/0049326 A1 Feb. 18, 2016

(30) Foreign Application Priority Data

Aug. 14, 2014 (JP) ................................. 2014-165074

(51) Int. Cl.
  *B25J 15/06* (2006.01)
  *H01L 21/683* (2006.01)
  *B24B 37/34* (2012.01)
  *H01L 21/677* (2006.01)
  *B25J 11/00* (2006.01)

(52) U.S. Cl.
  CPC .......... *H01L 21/6838* (2013.01); *B24B 37/345* (2013.01); *B25J 11/0095* (2013.01); *B25J 15/0616* (2013.01); *H01L 21/67778* (2013.01)

(58) Field of Classification Search
  CPC .......................... B25J 15/0616; B25J 15/0683
  USPC ................. 294/183, 186, 188, 189, 213, 902; 901/40; 414/941; 269/21
  See application file for complete search history.

(56) References Cited

U.S. PATENT DOCUMENTS

| | | | | |
|---|---|---|---|---|
| 3,720,433 A | * | 3/1973 | Rosfelder | B66C 1/0243 294/188 |
| 4,773,687 A | * | 9/1988 | Bush | B25J 15/0616 294/64.3 |
| 5,879,040 A | * | 3/1999 | Nagai | F16B 47/00 279/3 |
| 5,937,993 A | * | 8/1999 | Sheets | B25B 11/005 198/345.1 |
| 6,062,241 A | * | 5/2000 | Tateyama | B25B 11/007 134/133 |
| 6,322,116 B1 | * | 11/2001 | Stevens | B25B 9/00 294/64.3 |
| 6,942,265 B1 | * | 9/2005 | Boyd | H01L 21/67742 294/189 |
| 7,055,875 B2 | * | 6/2006 | Bonora | H01L 21/6838 294/188 |
| 7,669,903 B2 | * | 3/2010 | Bonora | H01L 21/6838 294/188 |
| 8,864,202 B1 | * | 10/2014 | Schrameyer | B25J 15/0014 294/213 |
| 8,991,887 B2 | * | 3/2015 | Shin | H01L 21/67742 294/183 |

FOREIGN PATENT DOCUMENTS

WO WO 03/077295 A1 9/2003

* cited by examiner

*Primary Examiner* — Paul T Chin
(74) *Attorney, Agent, or Firm* — Greer Burns & Crain, Ltd.

(57) ABSTRACT

A transfer unit transferring a wafer from or to a cassette is provided. The transfer unit includes a holding portion holding the wafer under suction and a driving portion moving the holding portion. The holding portion includes a body, a plurality of suction openings formed on the upper surface of the body so as to be spaced from each other, a vacuum transmitting passage connected to a vacuum source for transmitting a vacuum from the vacuum source to the suction openings, and a plurality of suction pads provided at the suction openings, each suction pad being formed of an elastic material. The suction openings are spaced from each other in the radial direction of the wafer, and the suction pads are selectively provided at any desired ones of the suction openings.

7 Claims, 3 Drawing Sheets

TRANSFER UNIT INCLUDING SUCTION OPENINGS CONFIGURED TO RECEIVE SUCTION PADS OR SEAL MEMBERS THEREIN

BACKGROUND OF THE INVENTION

1. Field of the Invention

The present invention relates to a transfer unit transferring a platelike workpiece such as a semiconductor wafer from or to a cassette.

2. Description of the Related Art

In recent years, it has been desired to reduce the thickness of a wafer such as a silicon wafer by grinding for realization of device chips reduced in size and weight. For example, this grinding is performed by using a grinding apparatus including a chuck table holding the wafer under suction and a grinding wheel provided above the chuck table, the grinding wheel having a plurality of abrasive members grinding the upper surface of the wafer held on the chuck table. In operation, both the chuck table and the grinding wheel are rotated and the grinding wheel is lowered to bring the abrasive members into contact with the upper surface (work surface) of the wafer, thereby grinding the upper surface of the wafer to thereby reduce the thickness of the wafer.

In the case of cutting the wafer reduced in thickness and accordingly reduced in rigidity by using a cutting blade or the like to divide the wafer into a plurality of device chips, a problem such as chipping and cracking of the wafer tends to occur. To cope with this problem, there has recently been put into practical use a processing method including the steps of applying a laser beam having a wavelength hardly absorptive to a wafer in the condition where the laser beam is focused inside the wafer, thereby forming a modified layer as a break start point inside the wafer, and next grinding the wafer (see PCT Patent Publication No. WO03/077295, for example). In this processing method, an external force applied to the wafer in grinding is used to divide the wafer into a plurality of device chips as reducing the thickness of the wafer. Accordingly, it is unnecessary to cut the wafer reduced in rigidity.

SUMMARY OF THE INVENTION

In focusing the laser beam inside the wafer to form the modified layer, the wafer may partially expand to be curved. A transfer unit transferring the wafer includes a flat holding portion having a plurality of suction openings holding the wafer under suction. However, when the wafer is curved as described above, the leak of air occurs in the vicinity of the suction openings, causing a problem that the wafer cannot be properly held under suction by the holding portion.

By correcting for the curvature of the wafer, the transfer unit can yet properly hold the wafer under suction. However, since the rigidity of the wafer is reduced by the modified layer, the wafer may be broken with a high probability by a local force applied at the suction openings to correct for the curvature of the wafer. Further, every time the diameter of the wafer to be transferred by the transfer unit is changed, it is necessary to perform an extensive operation such as replacement of the holding portion.

It is therefore an object of the present invention to provide a transfer unit which can properly hold a curved wafer and can also easily respond to a change in diameter of the wafer.

In accordance with an aspect of the present invention, there is provided a transfer unit transferring a wafer from or to a cassette, the transfer unit including a holding portion holding the wafer under suction and a driving portion moving the holding portion, the holding portion including a body; a plurality of suction openings formed on an upper surface of the body so as to be spaced from each other; a vacuum transmitting passage connected to a vacuum source for transmitting a vacuum from the vacuum source to the suction openings; and a plurality of suction pads provided at the suction openings, each suction pad being formed of an elastic material; wherein the suction openings are spaced from each other in a radial direction of the wafer, and the suction pads are selectively provided at any desired ones of the suction openings.

The transfer unit according to the present invention has the holding portion including the suction pads provided at the suction openings, wherein each suction pad is formed of an elastic material, and each suction pad operates to hold the wafer under suction. Accordingly, each suction pad is deformable according to the shape of the wafer, so that even when the wafer is curved, each suction pad can properly hold the wafer under suction. Further, the suction openings are spaced from each other in the radial direction of the wafer, and the suction pads are selectively provided at any desired ones of the suction openings. Accordingly, even when the diameter of the wafer varies, the holding portion can easily respond to this variation by simply changing the suction openings where the suction pads are provided. Thus, the transfer unit according to the present invention described above can properly hold a curved wafer and can also easily respond to a change in diameter of the wafer.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
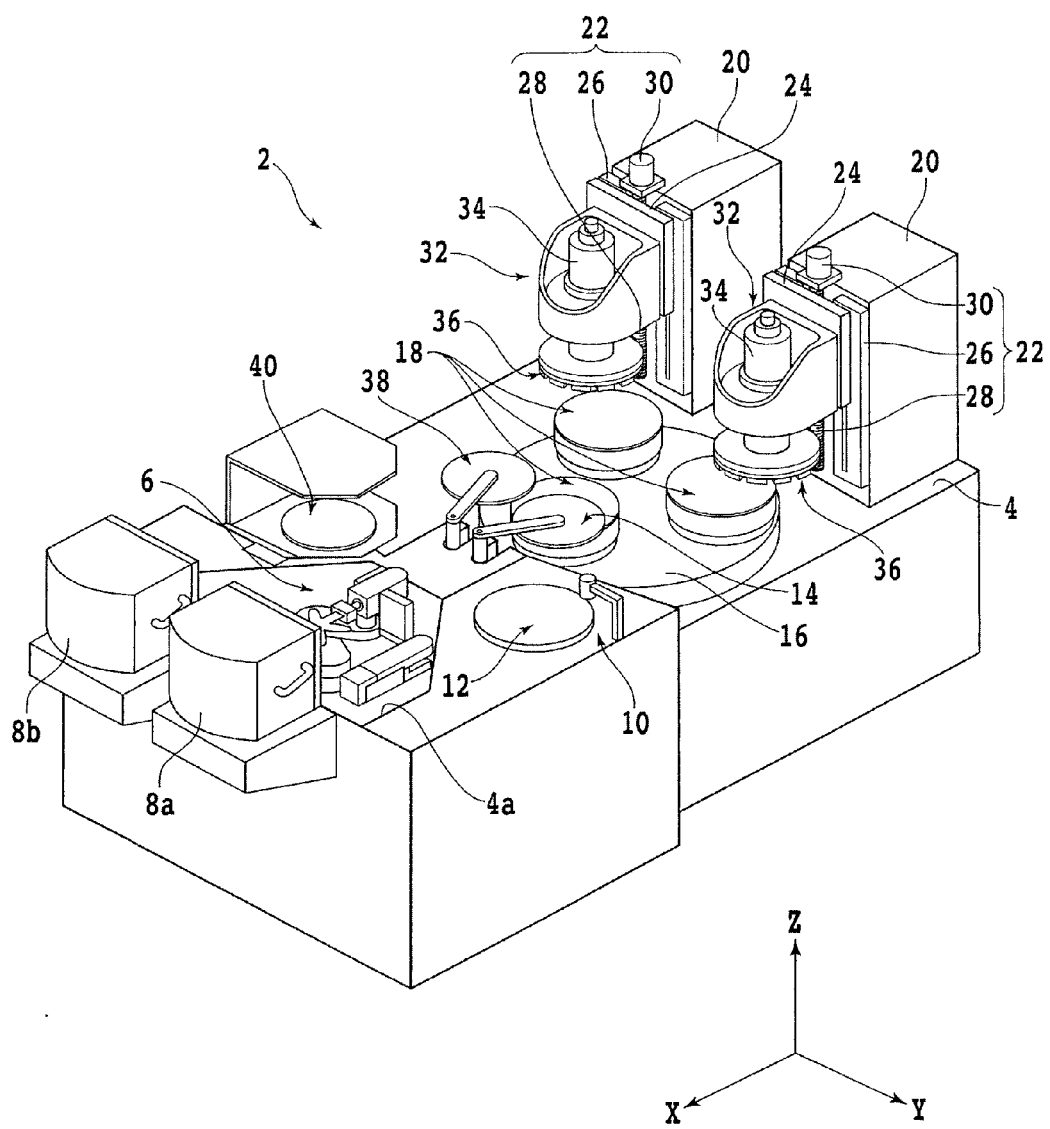
FIG. 1 is a schematic perspective view of a grinding apparatus incorporating a transfer unit according to a preferred embodiment of the present invention.

A preferred embodiment of the present invention will now be described with reference to the attached drawings. A grinding apparatus incorporating a transfer unit according to the preferred embodiment will now be described. FIG. 1 is a schematic perspective view of the grinding apparatus incorporating the transfer unit according to the preferred embodiment. While the transfer unit according to the preferred embodiment is incorporated in the grinding apparatus, the transfer unit in the present invention may be used solely or may be incorporated in any other processing apparatuses such as a cutting apparatus.

As shown in FIG. 1, reference numeral 2 generally denotes a grinding apparatus. The grinding apparatus 2 includes a base 4 supporting various components. An opening 4a is formed on the upper surface of the base 4 at a front end portion thereof. A transfer unit 6 transferring a disk-shaped wafer 11 (see FIGS. 2 and 3B) is provided in the opening 4a. Two cassettes 8a and 8b capable of storing a plurality of wafers 11 are placed in an area on the front side of the opening 4a. An alignment mechanism 10 is provided on the rear side of the placement area for the cassette 8a and the opening 4a. The alignment mechanism 10 includes a temporary setting table 12 temporarily setting the wafer 11 thereon. For example, the alignment mechanism 10 functions to detect the center position of the wafer 11 transferred from the cassette 8a to the temporary setting table 12 and set on the temporary setting table 12.

A loading mechanism 14 holding the wafer 11 under suction and pivotally moving the wafer 11 is provided adjacent to the alignment mechanism 10. The loading mechanism 14 includes a suction pad holding the whole of the upper surface of the wafer 11 under suction. The wafer 11 is transferred from the alignment mechanism 10 to a loading position by the loading mechanism 14. A turn table 16 is provided on the rear side of the loading mechanism 14. The turn table 16 is rotatable about its axis extending in the vertical direction. Three chuck tables 18 each holding the wafer 11 under suction are provided on the upper surface of the turn table 16. The number of such chuck tables 18 to be provided on the turn table 16 is not limited to three.

The wafer 11 is held under suction by the suction pad of the loading mechanism 14 and loaded to the chuck table 18 set at the loading position in such a manner that the center of the wafer 11 comes into coincidence with the center of the chuck table 18 at the loading position. Each chuck table 18 is connected to a rotating mechanism (not shown) such as a motor, so that each chuck table 18 is rotatable about its axis extending in the vertical direction. The upper surface of each chuck table 18 functions as a holding surface holding the wafer 11 under suction. The holding surface of each chuck table 18 is connected to a vacuum source (not shown) through a suction passage (not shown) formed in each chuck table 18. The wafer 11 loaded to each chuck table 18 is held under suction in such a manner that a vacuum produced by the vacuum source is applied to the holding surface of each chuck table 18 to hold the lower surface of the wafer 11.

Two support structures 20 are provided on the rear side of the turn table 16 so as to vertically extend from the upper surface of the base 4. A Z plate 24 is movably supported through a Z moving mechanism 22 to the front surface of each support structure 20. Each Z moving mechanism 22 includes a pair of parallel Z guide rails 26 extending in the Z direction shown by an arrow Z in FIG. 1. Each Z plate 24 is slidably mounted on the corresponding Z guide rails 26. A nut portion (not shown) is provided on the rear surface (back side) of each Z plate 24, and a Z ball screw 28 parallel to the Z guide rails 26 is threadedly engaged with the nut portion. A Z pulse motor 30 is connected to one end of each Z ball screw 28. Accordingly when each Z pulse motor 30 is operated to rotate the corresponding Z ball screw 28, the corresponding Z plate 24 is moved along the corresponding Z guide rails 26 in the Z direction.

A grinding mechanism 32 is provided on the front surface (front side) of each Z plate 24. Each grinding mechanism 32 includes a spindle housing 34 fixed to the corresponding Z plate 24. A spindle (not shown) as a rotating shaft is rotatably supported to each spindle housing 34. A grinding wheel 36 is mounted on the lower end of each spindle. Each grinding wheel 36 includes a circular wheel base formed of a metal material such as aluminum and stainless steel and a plurality of abrasive members fixed to the lower surface of the wheel base so as to be arranged annularly.

When the wafer 11 is held under suction on the chuck table 18 set at the loading position, the turn table 16 is rotated to move the wafer 11 to a grinding position below each grinding mechanism 32. In the grinding position, both the chuck table 18 and the grinding wheel 36 are rotated and the grinding mechanism 32 is lowered to bring the abrasive members of the grinding wheel 36 into contact with the upper surface of the wafer 11, thereby grinding the wafer 11. An unloading mechanism 38 holding the wafer 11 under suction after grinding and pivotally moving the wafer 11 is provided adjacent to the loading mechanism 14. A cleaning mechanism 40 cleaning the wafer 11 unloaded from the chuck table 18 by the unloading mechanism 38 is provided on the front side of the unloading mechanism 38 and on the rear side of the opening 4a. The wafer 11 cleaned by the cleaning mechanism 40 is transferred to the cassette 8b by the transfer unit 6 and stored into the cassette 8b.

Figure 2:
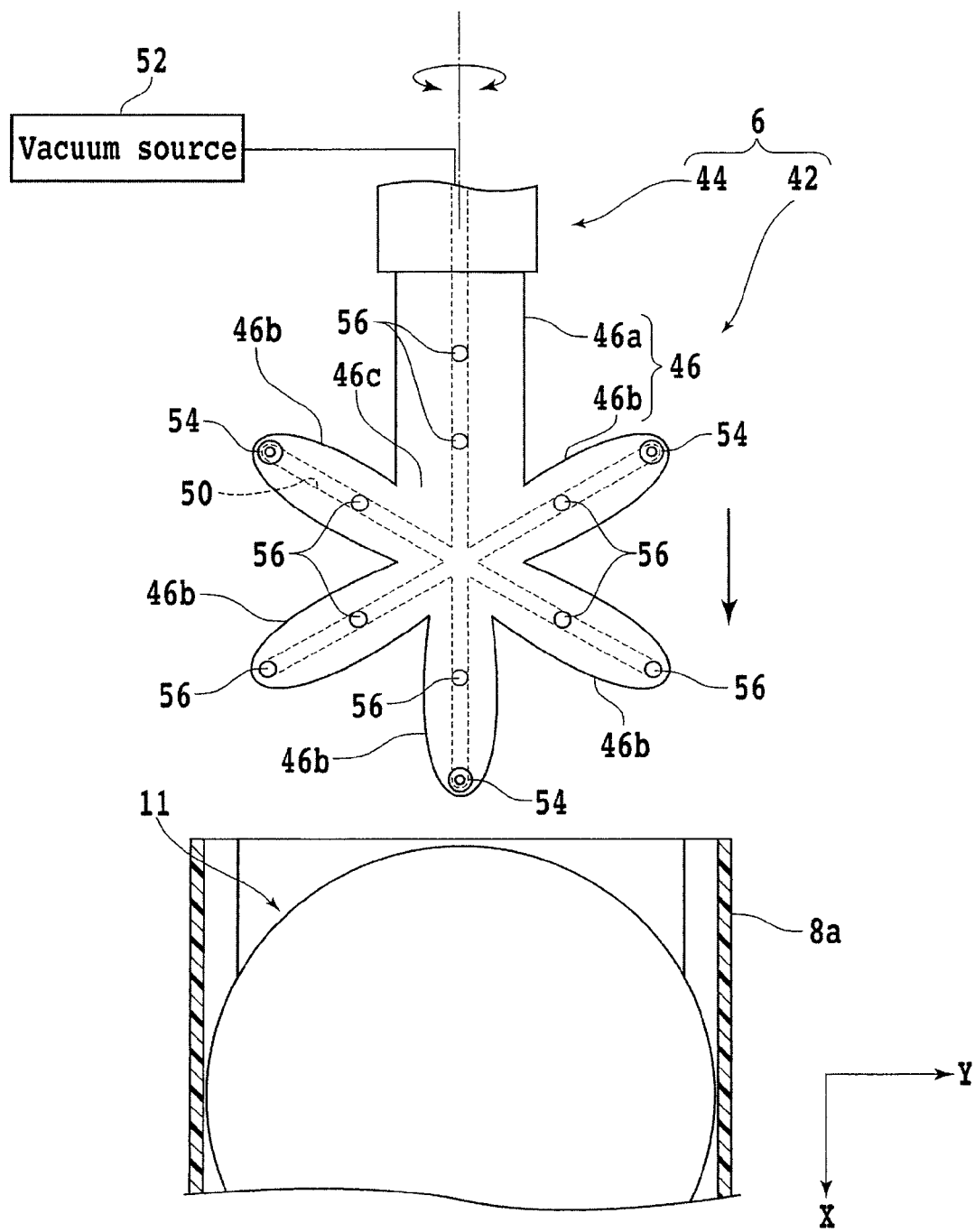
FIG. 2 is a schematic plan view of the transfer unit.
Figure 3A:
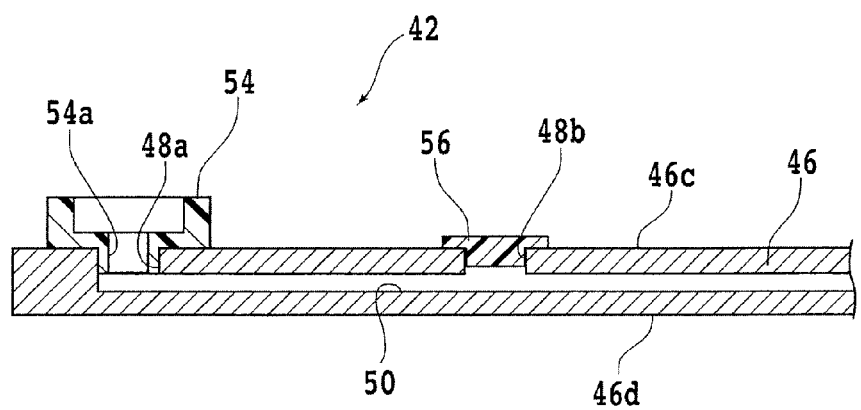
FIG. 3A is a schematic sectional view of an essential part of the transfer unit.

The transfer unit 6 will now be described in more detail. FIG. 2 is a schematic plan view of the transfer unit 6, and FIG. 3A is a schematic sectional view of an essential part of the transfer unit 6. In FIG. 2, there is also shown a horizontal sectional view of the cassette 8a storing the wafer 11. As shown in FIG. 2, the transfer unit 6 includes a holding portion 42 holding the wafer 11 under suction. The holding portion 42 is connected at its base end to a driving portion 44. The driving portion 44 functions to move the holding portion 42 among the cassettes 8a and 8b, the temporary setting table 12, and the cleaning mechanism 40. Further, the holding portion 42 is rotatable about a horizontal axis by the driving portion 44.

The holding portion 42 includes a body 46 having a predetermined size (e.g., a size insertable into the cassettes 8a and 8b). The body 46 is composed of a base portion 46a connected at its base end to the driving portion 44 and five branch portions 46b radially extending from the front end of the base portion 46a. As shown in FIG. 3A, the body 46 has an upper surface 46c and a lower surface 46d which are substantially flat. Each branch portion 46b has a length corresponding to the radius of the wafer 11 (e.g., a length slightly less than the radius of the wafer 11). The base portion 46a is somewhat longer than each branch portion 46b. However, the size, shape, etc. of the body 46 are not limited to those described above. For example, the body 46 may be formed to have a circular shape.

As shown in FIG. 3A, the upper surface 46c of the body 46 is formed with a plurality of suction openings 48a and 48b spaced from each other. More specifically, six suction openings 48a and six suction openings 48b are formed, wherein the base portion 46a has one of the six suction openings 48a and one of the six suction openings 48b, and five branch portions 46b have the remaining five suction openings 48a and the remaining five suction openings 48b, respectively. A vacuum transmitting passage 50 is formed in the body 46, and all of the suction openings 48a and 48b are connected to the vacuum transmitting passage 50. As shown in FIG. 2, the vacuum transmitting passage 50 is connected at the base portion 46a to a vacuum source 52. Accordingly, a vacuum produced by the vacuum source 52 is transmitted through the vacuum transmitting passage 50 to all of the suction openings 48a and 48b.

As described above, the base portion 46a has the suction opening 48a and the suction opening 48b, and each branch portion 46b also has the suction opening 48a and the suction opening 48b. More specifically, the suction opening 48a of the base portion 46a is formed near the base end of the base portion 46a which base end is connected to the driving portion 44, and the suction opening 48a of each branch portion 46b is formed near the front end of each branch portion 46b. Further, the suction opening 48b of the base portion 46a is formed near the front end of the base portion 46a, and the suction opening 48b of each branch portion 46b is formed near the base end of each branch portion 46b. Thus, the suction openings 48a and 48b of the base portion 46a are spaced from each other in the longitudinal direction of the base portion 46a (in the radial direction of the wafer 11). Similarly, the suction openings 48a and 48b of each branch portion 46b are spaced from each other in the longitudinal direction of each branch portion 46b (in the radial direction of the wafer 11). With this arrangement, the transfer unit 6 can hold and transfer at least two kinds of wafers 11 different in diameter. The positions and number of the suction openings 48a and 48b are not limited to those described above. For example, a plurality of suction openings may be further formed at the positions radially inside of the suction openings 48b toward the center of the body 46.

As shown in FIG. 2, three suction pads 54 are mounted in three selected ones of the six suction openings 48a of the holding portion 42. Each suction pad 54 is formed of an elastic material such as rubber. The elastic material is defined as a material having a modulus of elasticity and elastic limit such that the material is elastically deformed by the weight of the wafer 11 so as to follow the shape of the lower surface of the wafer 11. As shown in FIG. 3A, each suction pad 54 mounted in the suction opening 48a projects upward from the upper surface 46c of the body 46. Each suction pad 54 has a central through hole 54a extending in the vertical direction. The through hole 54a of each suction pad 54 mounted in the suction opening 48a is in communication with the vacuum transmitting passage 50. Accordingly, the vacuum transmitted from the vacuum source 52 through the vacuum transmitting passage 50 acts on the upper surface of each suction pad 54 coming into contact with the wafer 11. As shown in FIG. 2, a plurality of seal members 56 preventing the leak of air are mounted in the remaining three suction openings 48a and all the six suction openings 48b. While the suction pads 54 are mounted in the three selected suction openings 48a not adjacent to each other and the seal members 56 are mounted in the remaining suction openings 48a and all the suction openings 48b in the preferred embodiment, the arrangement of the suction pads 54 and the seal members 56 is not limited to that described above.

As shown in FIG. 2, the holding portion 42 of the transfer unit 6 is inserted into the cassette 8a by the driving portion 44 in such a manner that the upper surface of each suction pad 54 comes into contact with the lower surface of the wafer 11. In the condition where the upper surface of each suction pad 54 is in contact with the lower surface of the wafer 11, the vacuum produced by the vacuum source 52 is applied to the upper surface of each suction pad 54, thereby holding the wafer 11 under suction on the suction pads 54 of the holding portion 42.

Figure 3B:
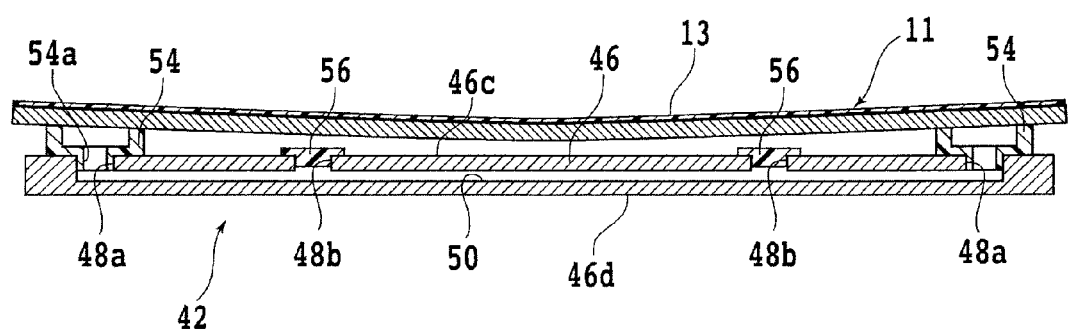
FIG. 3B is a schematic sectional view showing the condition where a wafer is held under suction by the transfer unit.

FIG. 3B is a schematic sectional view showing the condition where the wafer 11 is held under suction by the transfer unit 6. As shown in FIG. 3B, a protective member 13 is attached to the upper surface of the wafer 11, and the wafer 11 is curved so as to be convex downward. As described above, each suction pad 54 is formed of an elastic material, so that when the wafer 11 is supported on the suction pads 54 of the holding portion 42, each suction pad 54 is slightly deformed so as to follow the shape of the wafer 11. Accordingly, the leak of air can be prevented between the wafer 11 and each suction pad 54 of the holding portion 42, so that the wafer 11 can be properly held under suction on the suction pads 54 and taken out of the cassette 8a by the transfer unit 6.

After taking the wafer 11 out of the cassette 8a, the holding portion 42 is rotated 180 degrees about its horizontal axis to thereby invert the wafer 11. Thereafter, the wafer 11 is transferred to the temporary setting table 12 by the transfer unit 6.

At the temporary setting table 12, the wafer 11 is suitably positioned by the alignment mechanism 10 and then loaded to the chuck table 18 by the loading mechanism 14. As described above, the loading mechanism 14 has a suction pad adapted to hold the whole of the upper surface of the wafer 11 under suction, thereby correcting for the curvature of the wafer 11. Accordingly, there is almost no possibility that the wafer 11 may be damaged by a local force. In contrast, in the case that the whole surface of the wafer 11 cannot be held under suction because of the limit to the size of the holding portion 42 as in taking the wafer 11 out of the cassette 8a, the configuration of the transfer unit 6 in the preferred embodiment is especially effective.

As described above, the transfer unit 6 according to the preferred embodiment has the holding portion 42 including the suction pads 54 selectively provided at the suction openings 48a and 48b (e.g., the suction pads 54 being provided at three selected ones of the six suction openings 48a in the preferred embodiment), wherein each suction pad 54 is formed of an elastic material, and each suction pad 54 operates to hold the wafer 11 under suction. Accordingly, each suction pad 54 is deformable according to the shape of the wafer 11, so that even when the wafer 11 is curved, each suction pad 54 can properly hold the wafer 11 under suction. Further, the suction openings 48a and 48b are spaced from each other in the radial direction of the wafer 11, and the suction pads 54 are selectively provided at any desired ones of the suction openings 48a and 48b. Accordingly, even when the diameter of the wafer 11 varies, the holding portion 42 can easily respond to the variation by simply changing the suction openings 48a and 48b where the suction pads 54 are provided.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A transfer unit transferring a wafer from or to a cassette, said transfer unit comprising:
    a holding portion holding said wafer under suction and a driving portion moving said holding portion, said holding portion including:
        a body;
        a plurality of suction openings formed on an upper surface of said body so as to be spaced from each other;
        a vacuum transmitting passage connected to a vacuum source for transmitting a vacuum from said vacuum source to said suction openings;
        a plurality of suction pads provided in at least some of said suction openings, each suction pad being formed of an elastic material, wherein each suction pad includes a through hole therein that is configured and arranged for transmitting the vacuum from the vacuum transmitting passage to the wafer; and
        a plurality of seal members provided in at least some of said suction openings, wherein each seal member is configured and arranged for preventing the vacuum from being transmitted, via the associated suction opening, between the vacuum transmitting passage and the wafer;
    wherein said suction openings are spaced from each other in a radial direction of said wafer, and
    said suction pads are selectively provided at any desired ones of said suction openings and said seal members are provided in the remainder of said suction openings.

2. The transfer unit according to claim 1, wherein:
said body comprises a base portion and another portion attached to said base portion; and
said suction openings comprise:
- a first group of suction openings formed at a first radial distance from a center of said another portion of said body; and
- a second group of suction openings formed at a second radial distance from the center of said another portion of said body, wherein said second radial distance is different from said first radial distance, and
- each of said suction openings in said first group includes one of said seal members therein, and
- each of said section openings in said second group includes either one of said seal members therein or one of said suction pads therein.

3. The transfer unit according to claim 2, wherein half of said suction openings in said second group include one of said seal members therein and the other half of said suction openings in said second group include one of said suction pads therein.

4. The transfer unit according to claim 1, wherein said body comprises a base portion and a plurality of branch portions radially extending from a front end of the base portion.

5. The transfer unit according to claim 4, said suction openings comprise:

- a first group of suction openings formed at a first radial distance from a center of an intersection of said branch portions; and
- a second group of suction openings formed at a second radial distance from the center of the intersection of said branch portions, wherein said second radial distance is different from said first radial distance, and
- wherein each of said suction openings in said first group includes one of said seal members therein, and
- wherein each of said section openings in said second group includes either one of said seal members therein or one of said suction pads therein.

6. The transfer unit according to claim 5, wherein half of said suction openings in said second group include one of said seal members therein and the other half of said suction openings in said second group include one of said suction pads therein.

7. The transfer unit according to claim 1, wherein said plurality of said suction openings are configured and arranged such that said suction pads and said seal members can be provided within said suction openings in a first arrangement for wafers of a first diameter and that said suction pads and said seal members can be provided within said suction openings in a second arrangement for wafers of a second diameter, wherein said first arrangement is different from said second arrangement and said first diameter is different from said second diameter.

* * * * *